United States Patent [19]
Burke et al.

[11] Patent Number: 5,264,794
[45] Date of Patent: Nov. 23, 1993

[54] METHOD OF MEASURING MAGNETIC FIELDS ON MAGNETICALLY RECORDED MEDIA USING A SCANNING TUNNELING MICROSCOPE AND MAGNETIC PROBE

[75] Inventors: Edward R. Burke, Silver Spring; Isaak D. Mayergoyz, Rockville; Amr A. Adly, Hyattsville; Romel D. Gomez, Beltsville, all of Md.

[73] Assignee: The United States of America as represented by the Director, National Security Agency, Washington, D.C.

[21] Appl. No.: 947,693

[22] Filed: Sep. 21, 1992

[51] Int. Cl.$^5$ .................. G01R 33/00; G01R 33/12
[52] U.S. Cl. .................................. 324/260; 324/212
[58] Field of Search ............... 324/212, 244, 260, 262

[56] References Cited

U.S. PATENT DOCUMENTS

| | | | |
|---|---|---|---|
| 4,232,265 | 4/1980 | Smirnov | 324/260 |
| 4,567,439 | 1/1986 | McGregor | 324/304 |
| 4,625,166 | 11/1986 | Steingroever et al. | 324/223 |
| 4,710,715 | 12/1987 | Mee et al. | 324/307 |
| 4,791,368 | 12/1988 | Tsuzuki | 324/301 |

OTHER PUBLICATIONS

Magnetic Tip Sees Fine Detail, Lost Data, E. Pennisi, Feb. 29, 1992, Science News, p. 135.
Magnetic Field Imaging by Using Magnetic Force Scanning Tunneling Microscopy, Gomez, Burke, Adly, Mayergoyz, Feb. 17, 1992 pp. 906-908 Appl. Phy. Lett.
Tunneling-Stabilized Magnetic Force Microscopy of Bit Tracks . . . , Rice, Moreland, IEEE Trans. on Magnetics vol. 27 No. 3 May 1998, pp. 3452-3454.
Magnetic Force Scanning Tunneling Microscope Imaging of Overwritten Data, Gomez, Adly, Mayergoyz, Burke, IEEE Journal of Magnetics, Sep. 1992.
Analysis of Tunneling Magnetic Force Microscopy Using a Flexible Triangular Probe, Burke, Gomez, Adly, Mayergoyz, IEEE Journal of Magnetics, Sep. 1992.
Magnetic Force Microscopy: General Principles and Application to . . . , Rugar, Mamin, et al. Journal of Appl. Phys., Aug. 1, 1990 pp. 1169-1183.
Analysis of In-Plane Bit Structure by Magentic Force Microscopy, Wadas, Grutter, Guntherodt, J. Appl Phys. Apr. 1, 1990 pp. 3462-3467.
Theoretical Approach to Magnetic Force Microscopy, Wadas, Grutter, American Physical Society, Jun. 1, 1989, 12,013-17.
Theory of Magnetic Imaging by Force Microscopy, Saenz, Garcia, Slonczewski, Appl. Phys. Letters, Oct. 10, 1988 pp. 1449-1451.
Description of Magnetic Imaging in Atomic Force Microscopy, Wadas, Journal of Magnetism and Magnetic Materials, Aug. 1989 pp. 263-268.

*Primary Examiner*—Walter E. Snow
*Attorney, Agent, or Firm*—Robert D. Morelli; Thomas O. Maser

[57] ABSTRACT

The present invention discloses a method of measuring magnetic fields on magnetically recorded media. The method entails replacing the metal tip typically used with a scanning tunneling microscope with a flexible thin-film nickel of iron magnetic probe. The present invention describes a mathematical equation that relates probe position to magnetic field strength. In order to establish a tunneling current between the magnetic probe and the magnetically recorded media, any protective layer on the magnetically recorded media is removed. The magnetic probe and the magnetically recorded media may be coated with at least three-hundred angstroms of gold in order to reduce spurious probe deflections due to oxide growths on either the magnetic probe or the magnetically recorded media. The scanning tunneling microscope is designed to maintain a constant tunneling current between the probe and the item being scanned. The present invention uses the scanning tunneling microscope to scan the recording tracks of magnetically recorded media. Any change in the magnetic field of the magnetically recorded media will cause a change in the tunneling current. The microscope will change the position of the probe in order to maintain a constant tunneling current. These changes in position are recorded as an image. A mathematical equation that relates probe position to magnetic field strength is then used to extract the magnetic fields of the magnetically recorded media from the recorded image of probe positions.

8 Claims, 4 Drawing Sheets

METHOD OF MEASURING MAGNETIC FIELDS ON MAGNETICALLY RECORDED MEDIA USING A SCANNING TUNNELING MICROSCOPE AND MAGNETIC PROBE

BACKGROUND OF THE INVENTION

1. Field of Invention

This invention relates to a method of measuring the magnetic fields of a recorded surface and more particularly to a method of measuring the magnetic fields of magnetically recorded information using a scanning tunneling microscope.

2. Description of Related Art

One of the most active areas in magnetic recording technology is the study of processes occurring at the microscopic level. In recent years, several techniques based on scanning tunneling microscopy have been developed to study magnetization patterns in recording media with sub-micron resolution. These include magnetic force microscopy (MFM), and tunneling stabilized (TS) or magnetic force scanning tunneling microscopy (MFSTM).

In "Tunneling-stabilized Magnetic Force Microscopy of Bit Tracks on a Hard Disk," a published article by P. Rice and J. Moreland in *IEEE Trans. Magn., vol. Mag-27*, 1991, pp. 3452-3454 it was shown that magnetic data on a hard disk can be imaged with a tunneling microscope by using a flexible triangular probe cut from a thin film of magnetic material.

In U.S. Pat. No. 4,791,368, entitled "Automatic Magnetic Field Measuring Apparatus Using NMR Principles," a method of more accurately measuring magnetic fields is described which entails surrounding the item being measured with a coil, initially measuring the magnetic field, estimating the magnetic resonance frequency of the item being measured, applying a high-frequency voltage of the estimated magnetic resonance frequency, iteratively refining the estimate of the magnetic resonance frequency until the variation in coil inductance is a maximum, and finally, from the resulting magnetic resonance frequency, calculating the magnetic field of the item being measured.

In U.S. Pat. No. 4,710,715, entitled "Method Of Mapping Magnetic Field Strength And Tipping Pulse Accuracy Of An NMR Imager," a method of checking the homogeneity of a magnetic field by producing contour lines of equal field strength is disclosed that utilizes a different preparation phase for NMR imaging. The new preparation phase consists of tipping the spins of the volume elements with a 90 degree wait 90 degree RF pulse sequence.

In U.S. Pat. No. 4,625,166, entitled "Method For Measuring Magnetic Potentials Using Hall Probes," a method of measuring the hysteresis curve of a magnetic material is disclosed. The steps of the method include subjecting the material to a magnetic field, summing the voltages from a plurality of Hall probes that are spaced in an arc, obtaining the magnetic flux density in the material, and deriving a hysteresis curve of the material from the magnetic flux density and the magnetic field intensity.

In U.S. Pat. No. 4,567,439, entitled "Apparatus For Measuring The Magnitude Of A Magnetic Field," a method of measuring the magnitude of a magnetic field is disclosed. The steps of the method include magnetizing the item, inducing an oscillating magnetic field, permitting free precession, inducing signals during free precession, and producing an output that is proportional to the frequency deviation of the induced signals.

In U.S. Pat. No. 4,232,265, entitled "Device For Measuring Intensity Of Magnetic Or Electromagnetic Fields Using Strain Gauges Mounted On Ferromagnetic Plates," a device is disclosed that measures magnetic fields by monitoring the electrical signal produced by strain gauges which are connected to overlapping ferromagnetic plates. The magnetic field to be measured causes the gap between the plates to change which in turn causes the electrical output signal from the strain gauges to change. The magnitude of the electrical signal indicates the magnitude of the magnetic field.

SUMMARY OF THE INVENTION

It is an object of this invention to provide a method of measuring magnetic fields.

It is another object of this invention to provide a method of measuring magnetic fields of magnetically recorded information.

It is another object of this invention to provide a method of measuring magnetic fields of magnetically recorded information using a scanning tunneling microscope.

It is another object of this invention to provide a method of measuring magnetic fields of magnetically recorded information using a scanning tunneling microscope that incorporates a thin-film magnetic probe that is used to relate probe position to magnetic field strength.

These objects are achieved by using a magnetic force scanning tunneling microscope to measure magnetic fields. This microscope, which is typically used for recording surface topology of an item, is modified by replacing the fine metallic tip with a flexible magnetic probe.

In the typical operation of a scanning tunneling microscope, the fine metallic tip, which is held at a bias potential, is placed in close proximity to the sample surface so that a tunneling current is established between the tip and the sample surface. As the tip scans across the surface, changes in surface topology cause the tunneling current to change. In order to maintain a constant tunneling current, the microscope changes the position of the tip. These changes in tip position are recorded in a two dimensional image that reflects the surface topology of the item scanned.

The present invention shows that by replacing the tip with a magnetic probe and by scanning recorded media along the recording tracks, which have no significant topological variations, the scanning tunneling microscope can be used to record the magnetic fields of the recorded media.

Just as surface variations caused changes in the tunneling current, changes in magnetic field cause changes in the tunneling current. The microscope will change the position of the probe, as it did with the metallic tip, in order to maintain a constant tunneling current. These position changes are recorded and, with the use of a mathematical equation that relates probe position to magnetic field strength, are used to measure the magnetic fields of the recorded media.

DESCRIPTION OF PREFERRED EMBODIMENTS

There is a growing interest in measuring magnetic fields created by magnetization patterns recorded on magnetic media. Since these fields vary over microscopic distances, various microscopic techniques have been developed. The present invention describes a method for measuring magnetic fields on magnetically recorded media by using a modified scanning tunneling microscope. These magnetic fields are measured by determining the relationship between the microscope probe movement and magnetic field strength.

Figure 1:
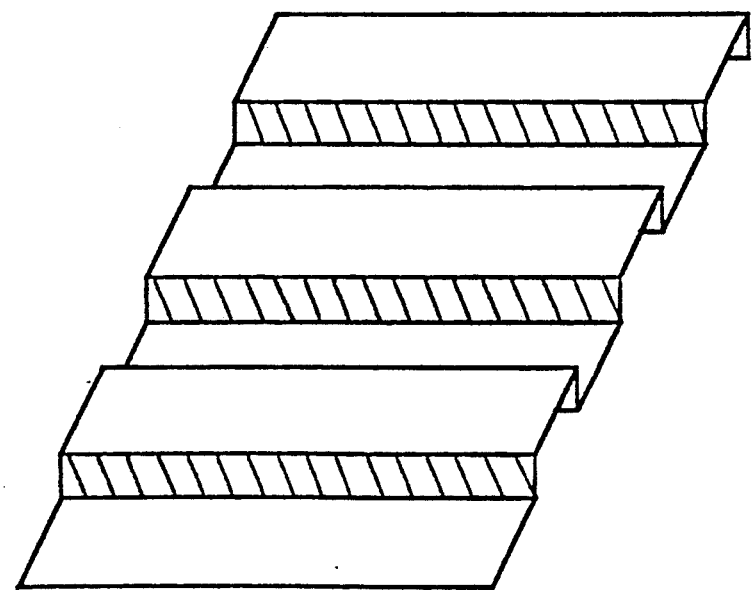
FIG. 1 is a perspective view of a typical image created by a scanning tunneling microscope.

The scanning tunneling microscope operates by scanning the surface of an object with a metal tip. The tip is biased with a dc voltage and placed close enough to the surface of the object to establish a tunneling current. Changes in the surface topology of the object cause a change in the tunneling current. A feedback system in the microscope adjusts the vertical position of the tip in order to maintain a constant tunneling current. As the tip is scanned across the object, the changes in tip position are recorded. These recordings reflect the surface topology of the item scanned. An example of such an image is indicated in FIG. 1.

The present invention discloses a method for using a modified magnetic force scanning tunneling microscope to measure magnetic fields. The metal tip of the microscope is replaced with a thin-film magnetic probe 20 of FIG. 2. Instead of scanning the surface topology of an item, the modified microscope is used to scan individual recording tracks of a magnetically recorded media which do not have any significant topological variations.

Just as was done with the metal tip, the probe 20 is placed in close proximity with the recorded media in order to establish a tunneling current. The probe 20 is then scanned along the recording tracks of the magnetically recorded media. Changes in magnetic field cause a change in the tunneling current. The microscope then changes the position of the probe 20 in order to maintain a constant tunneling current. These position changes are recorded and, with the use of a mathematical equation that relates probe position to magnetic field strength, used to measure the magnetic fields of the recorded media.

Figure 2:
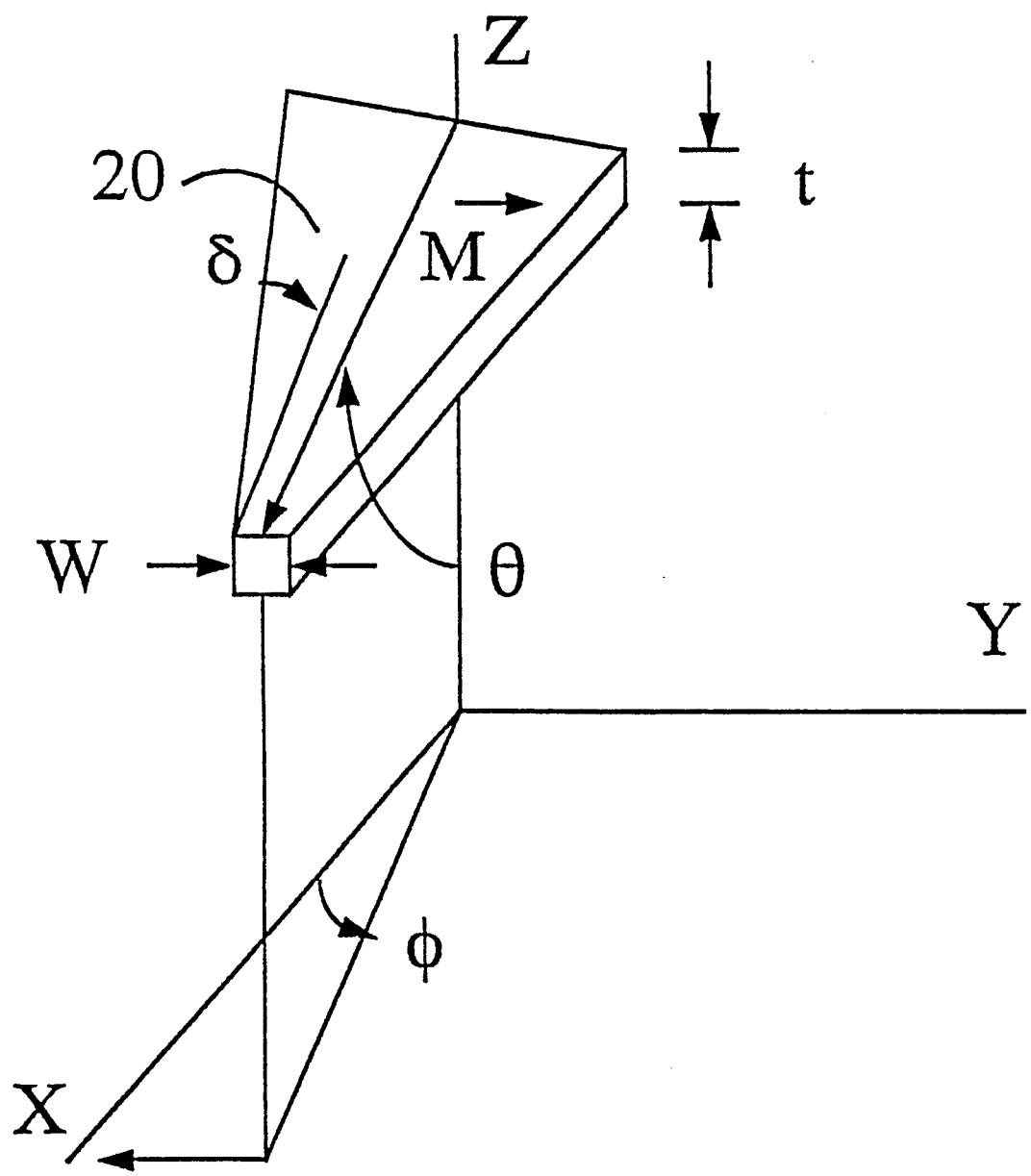
FIG. 2 is a perspective view of the magnetic probe superimposed upon a graph that indicates the critical dimensions, coordinates, and angles.

The energy of interaction between the probe 20 and the magnetic field emanating from the sample surface was evaluated using the geometry as shown in FIG. 2. It was assumed that the field interacts only with the last magnetic domain (i.e., a region that is magnetized in one direction only) at the tip of the probe 20 and that this domain is magnetized uniformly along its length. The magnetization pattern is typically a recorded signal with repetition in the x-direction and infinite extent in the y-direction.

Measurements were taken with a scanning tunneling microscope operating in a constant current mode with a maximum scan range in excess of 100 micrometers in each lateral dimension. The tunneling current is typically 0.11 nanoamperes, at a dc bias of 2.7 volts. The scan rate is about 1.5 lines per second. Any protective coatings on the recorded media must be removed. Adverse effects due to surface oxides on the probe 20 or recorded media are reduced by coating the recorded media and the tip of the probe 20 with approximately 300 angstroms of gold. Such a coating is typically deposited by conventional sputtering techniques.

The tunneling current changes as the probe 20 interacts with the surface and its magnetic fields. Feedback compensates for this change and the vertical displacement of the probe 20, $\Delta z$, is recorded as a function of its horizontal position. Therefore, a two dimensional image, similar to the image shown in FIG. 1, is formed that maps variations in z as a function of lateral position, i.e., $\Delta z(x,y)$. Such an image reflects both the topological and magnetic features of the magnetically recorded media. With the appropriate choice of probe 20 properties, it is possible to extract the magnetic fields from this image.

The magnetic contribution to the displacement, $\Delta z$, is determined by the forces acting on the probe 20. Several theoretical calculations that relate recorded images using such a probe 20 with the forces on the probe 20 have appeared in "Analysis of in-plane bit structure by magnetic force microscopy", a published article by A. Wadas, P. Grutter, and H. Guntherodt in *J. Appl. Phys.*, vol. 67, 1990, p. 3462 and "Theory of magnetic imaging by force microscopy," a published article by J. Saenz, N. Garcia, and J. Slonczewski in *Appl. Phys. Lett.* 53, 1988, p. 1449. However, these calculations have not directly addressed the issue of the dependence of image contrast and resolution on the orientation of the probe 20 as the present invention does.

By assuming that the probe 20 is uniformly magnetized along the direction of its length, the vertical displacement can be modeled by considering the interaction of the surface magnetic fields with a magnetic charge distribution at the tip of the probe 20. Flexible magnetic probes 20 made of nickel (Ni) can be used. The probes 20 used in the present invention were fabricated by evaporating approximately 500 nanometers of Ni onto pre-patterned substrates. These films retain the shape of the substrate pattern when peeled away from the pattern. A typical probe would have a thickness (t) of less than or equal to one micrometer, a length (l) of two millimeters, and a width (w) of one micrometer. The angle delta is typically 15 degrees. The angle theta can vary over a range of zero degrees to pi/2 degrees. The angle phi can vary over a range of $-\pi/2$ to $\pi/2$. It has been observed that these probes 20 produce consistent images of magnetization patterns.

FIG. 1 also shows the parameters for the equations used in the present invention. It was assumed that the recorded signal is a repetitive pattern of wavelength lambda ($\lambda$) in the x direction, with infinite extent in the y direction.

In "Theoretical approach to magnetic force microscopy," a published article by A. Wadas and P. Grutter in *Phys. Rev. B*, vol. 39, no. 16, June 1989, pp. 12013–12017 it was shown that the energy (E) of interaction between the field from the pattern and the last domain on the probe tip can be expressed as $$E = -\int H \cdot M \, dV,$$

where H is the magnetic field from the pattern, M is the magnetization of the domain, and V is the volume of the domain. The magnetic field can be expressed as the gradient of a scalar potential capital phi ($\Phi$), and, if the magnetization is uniform ($\nabla \cdot M = 0$ is sufficient), then the above equation for E can be rewritten as $$E = \int \nabla \cdot (\Phi M) \, dV.$$

This new equation for E can then be converted to a surface integral using Gauss's theorem to obtain $$E = \int \Phi M \cdot dA.$$

This latest equation simplifies the calculation of E and the identification of the source of the different terms. The scalar potential will then be of the form $$\Phi(x,z) = \sum_{n=1}^{\infty} \Phi_n e^{-kx} \cos kx,$$

where $k = 2\pi n/\lambda$ and the coefficients $\Phi n$ match the series solution to the particular field pattern. Specific values of $\Phi n$ for various field patterns can be found in "Theoretical approach to magnetic force microscopy," a published article by A. Wadas and P. Grutter in *Phys. Rev. B*, vol. 39, no. 16, pp 12013–12017, June 1989 and in "Analysis of in-plane bit structure by magnetic force microscopy," a published article by A. Wadas, P. Grutter, ad H. Gutheroit in *J. Appl. Phys.* 67 (7), pp. 3462–3467, 1990.

In the present invention, it was assumed that 1) the domain is magnetized along the probe axis by shape anisotropy, 2) the domain is much longer than $\lambda$ so that the limit of integration in the z direction can be extended to infinity, and 3) the thickness of the probe, t, is much less than the wavelength $\lambda$.

In "Magnetic force microscopy: General principles and application to longitudinal recording media," a published article by D. Rugar, H. Mamim, P. Guethner, S. Lambert, J. Stern, I. McFadyen, and T. Yogi in *J. Appl. Phys.* 68 (3), 1990, pp. 1169–1183, it was shown that the last domain on the probe was 20 micrometers in length. A domain length of this size is typically much longer than the wavelength of patterns on modern recording surfaces.

In calculating the energy of interaction (E), the last two equations are used to obtain $$E = Mtw \sum_{n=1}^{\infty} \Phi_n e^{-kx} \left( \cos kx \, \frac{\sin((kw\sin\phi)/2)}{(kw\sin\phi)/2} + \frac{\tan\delta}{wk} [A_+ \cos k(x - x_+) + A_- \cos k(x - x_-)] \right),$$

where, $$A_\pm = 1/\sqrt{\cos^2\theta + (\sin\theta\cos\phi \pm \tan\delta\sin\phi)^2},$$

and, $$X_\pm = \pm \frac{w}{2} \sin\phi + \frac{1}{k} \tan^{-1}\left( \frac{\sin\theta\cos\phi \pm \tan\delta\sin\phi}{\cos\theta} \right).$$

The integrals were preformed so that the point (x,z) is the coordinate of the probe tip. The first term in the calculation of the energy of interaction is due to a magnetic charge, Mtw, at the tip of the probe. The magnetic potential is weighted by a sampling factor caused by the variation in the field across the width, w, of the probe tip. The next two terms can be thought of as the contributions from the magnetic charges on the sides of the probe, separated from the tip by the distances $x\pm$.

The quantity that is measured by the tunneling microscope is the displacement, $\Delta z$, of the probe tip. The displacement is caused by both the surface topology and magnetic field of the recorded media. If the probe tip is properly designed, the magnetic interaction will predominate and the effects due to surface topology will b minimized.

If the probe is constrained to rotate in the theta ($\theta$) direction, the displacement will be given by $l\sin\theta\Delta\theta$, where l is the length of the probe's 20 moment-arm. A force, $F_N$, normal to the probe 20 will cause a rotation in the theta ($\theta$) direction such that $lF_N = -K\Delta\theta$ where K is the tip torque constant. The displacement $\Delta z$ is then given by $$\Delta z = \frac{l^2 F_N \sin\theta}{K}.$$

The force acting on the tip is the gradient of the energy, $F = -\nabla E$, so that $\Delta z$ further becomes $$\Delta z = \frac{l^2}{K} \left( \cos\theta\cos\phi \, \frac{\partial E}{\partial x} + \sin\theta \, \frac{\partial E}{\partial z} \right) \sin\theta.$$

Using the last equation and the equation for the energy (E) of interaction, $\Delta z$ becomes $$\Delta z = \frac{-l^2 M t w \sin\theta}{K} \sqrt{\cos^2\theta\cos^2\phi + \sin^2\theta} \times$$

$$\sum_{n=1}^{\infty} \Phi_n kC e^{-kx} \sin\left( kx - \beta + \tan^{-1} \frac{\sin\theta}{\cos\theta\cos\phi} \right),$$

where, $$C^2 = \left[ \frac{\sin((kw\sin\phi)/2)}{(kw\sin\phi)/2} + \frac{\tan\delta}{kw} (A_+ \cos kx_+ + A_- \cos kx_-) \right]^2 +$$

$$\left[ \frac{\tan\delta}{kw} (A_+ \sin kx_+ + A_- \sin kx_-) \right]$$

and, $$B = \tan^{-1} \frac{\tan\delta(A_+ \sin kx_+ + A_- \sin kx_-)}{\frac{\sin((kw\sin\phi)/2)}{(\sin\phi)/2} + \tan\delta(A_+ \cos kx_+ + A_- \cos kx_-)}$$

These last three equations give a complete description of the interaction between the probe and the recorded pattern. In general, the equations are quite complicated and their usefulness is not readily apparent. In the case where the probe lines up with the pattern (i.e., phi=0), so that the probe scans along the recorded information, the equation for $\Delta z$ reduces to a simple form, $$\Delta z = \frac{-l^2 M t w \sin\theta}{K} \left[ Hx\cos\theta + Hz\sin\theta + 2 \frac{\tan\delta}{w} \int_0^x Hz \, dx' \right].$$

The first two terms give the interaction between the magnetic field and the magnetic charge at the tip. The third term gives the effect of the charges on the sides of the probe. The third term was written in the integral form so that it could be expressed in terms of the magnetic field Hz. This last equation can be used to obtain relative values of the magnetic field components Hx and Hz. To obtain absolute values, the probe would have to be calibrated in a known field to obtain the factor (1**2)Mtw/K.

An alternative way to obtain the fields from the last equation is by obtaining three images at three different values of the angle theta ($\theta$). The fields Hx and Hz can then be obtained at every point from a linear combination of the three images. As an example, if the images were taken at theta equal to 30, 45, and 60 degrees then Hx and Hz would be given by the following two equations:

$$H_x = -18.01z(30°) - 13.55z(60°) + 29.35z(45°),$$

$$H_z = -23.48z(30°) - 10.40z(60°) + 29.35z(45°)$$

where $$z(\theta) = \frac{\Delta z(\theta°)}{-(l^2 Mtw/K)}.$$

If phi=0 is chosen as the angle of rotation of the probe, the angle theta must be determined to give the best image sensitivity. For $$\Delta z = \frac{-l^2 Mtw\sin\theta}{K} \sqrt{\cos^2\theta\cos^2\phi + \sin^2\theta} \times$$

$$\sum_{n=1}^{\infty} \Phi_n kCe^{-kx}\sin\left(kx - \beta + \tan^{-1}\frac{\sin\theta}{\cos\theta\cos\phi}\right),$$

the relative amplitude of the harmonics, for phi=0, will vary with theta as $$\sin\theta\sqrt{1 + a^2 + 2a\cos\theta}$$

where $$a = \frac{2\tan\delta}{kw}.$$

Figure 3:
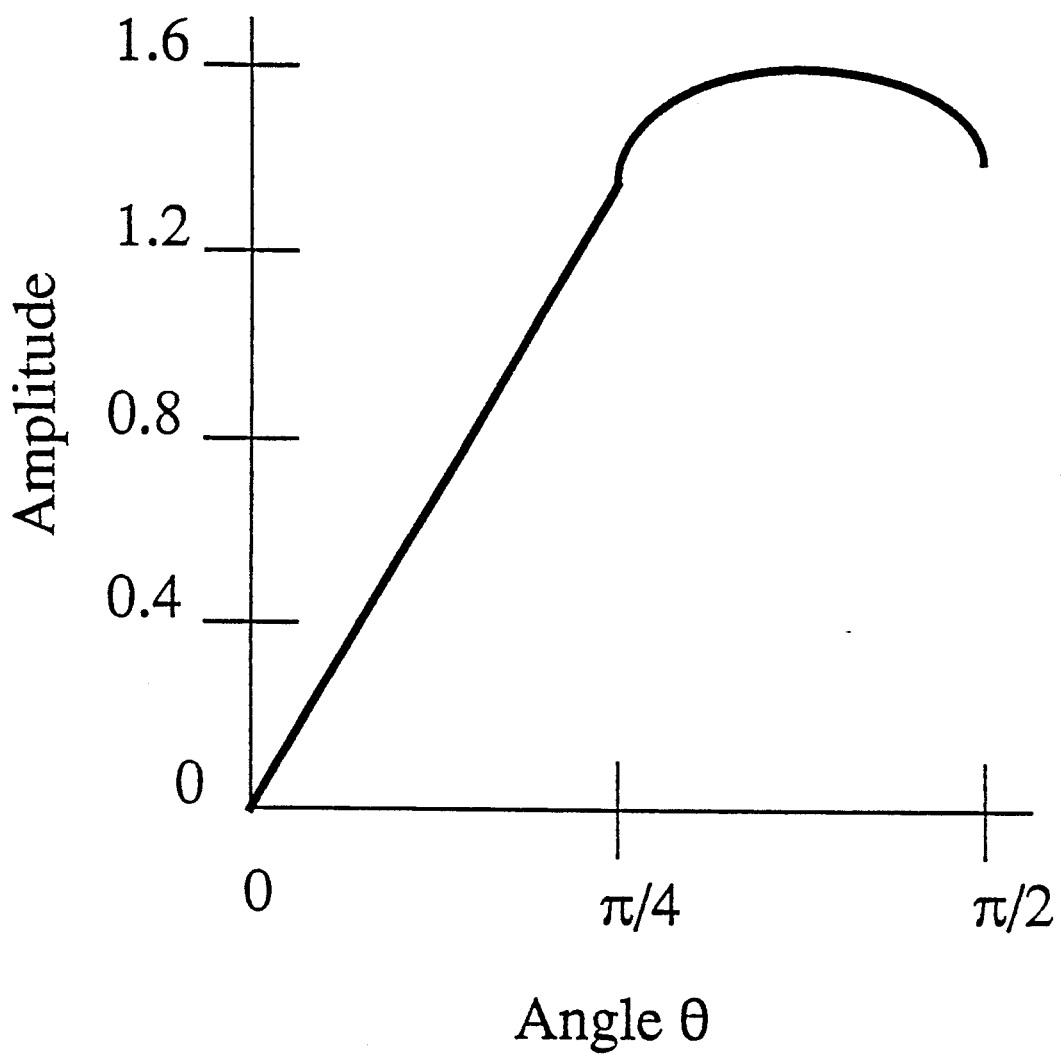
FIG. 3 is a chart showing the relationship between magnetic probe amplitude and the angle theta.

The amplitude will have a maximum near theta=pi/2 for both large and small values of a. Raising the elevation of the probe to this value would cause interactions with all the domains in the probe so a smaller value would have to be chosen. The smallest value of theta for which the amplitude is a maximum occurs when a=1, cos(theta)=⅓, and theta=70.5 degrees. This is still a relatively large elevation, but as can be seen from FIG. 3, the maximum occurs over a broad range. Adequate sensitivity can be achieved when theta is as small as 45 degrees.

Figure 4:
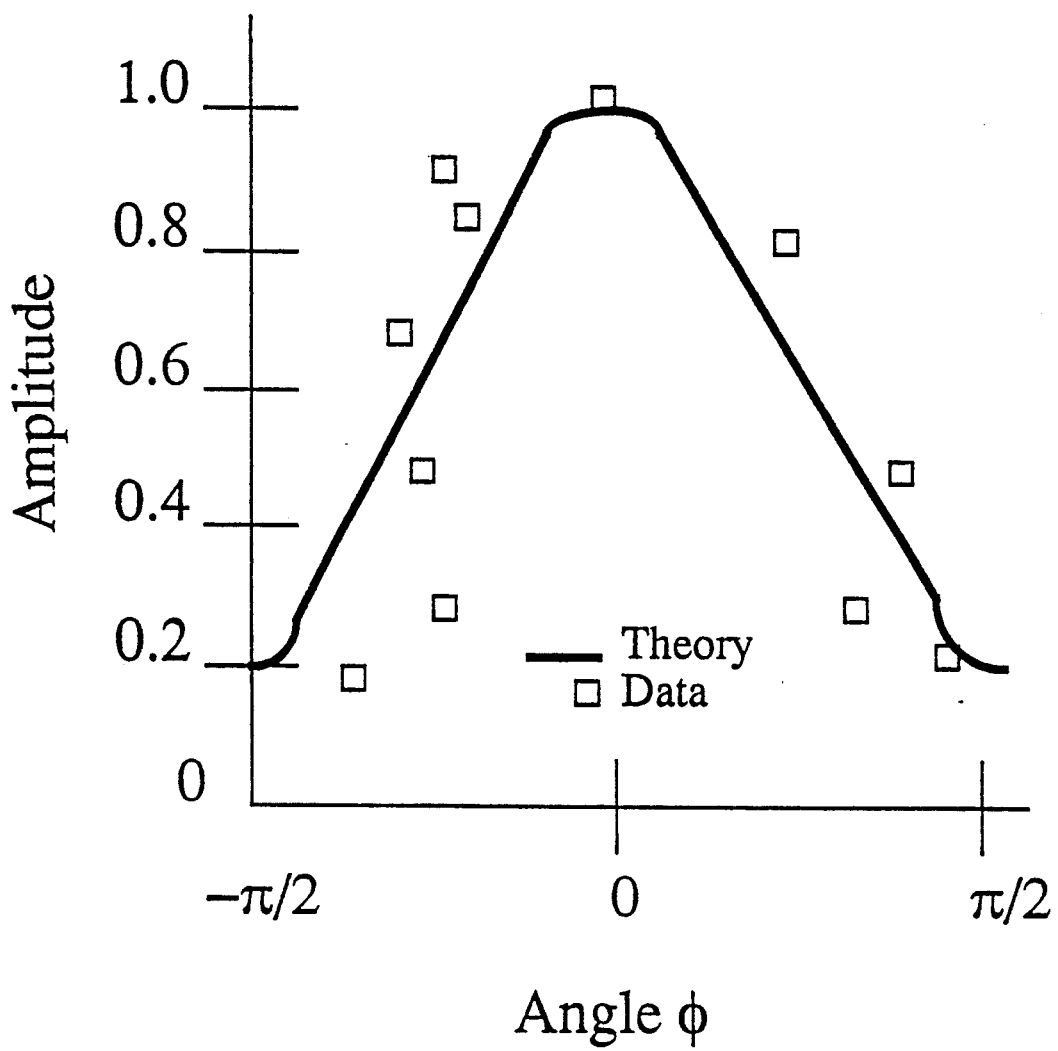
FIG. 4 is a chart that compares theoretically expected results of probe amplitude versus the angle phi against experimentally obtained data of probe amplitude versus the angle phi.

Numerous experiments were performed to verify the equations given above for $\Delta z$, C**2, and beta. Agreement between experimental data and theory, as shown in FIG. 4, is quite good. The theoretical curve was obtained using delta ($\delta$)=15 degrees, theta=12 degrees and w=1 micrometer. Error is introduced into the experimental data if, during rotation of the sample, a different recorded track is followed.

The method of the present invention shows how the constituent magnetic fields from recorded magnetic patterns can be obtained using a magnetic force scanning tunneling microscope. The sensitivity of the microscope will vary with the orientation of the probe. Changes and modifications in the specifically described embodiments can be carried out without departing from the scope of the invention which is intended to be limited only by the scope of the appended claims.

What is claimed is:

1. A method of measuring magnetic fields on magnetically recorded media comprising the steps of:
    (a) replacing the fine metallic tip of a scanning tunneling microscope with a flexible thin-film magnetic probe in order to relate probe position to magnetic field strength;
    (b) removing any protective layer from said magnetically recorded media so that said protective layer does not impede the establishment of a tunneling current between said magnetic probe and said magnetically recorded media;
    (c) aligning said magnetic probe with a recorded track of said magnetically recorded media at an angle of zero degrees;
    (d) positioning the tip of said magnetic probe to said magnetically recorded media at an angle in the range of zero degrees to pi/2 degrees in order to establish said tunneling current;
    (e) scanning said recorded track of said magnetically recorded media with said magnetic probe;
    (f) recording changes in position of said magnetic probe during said scanning of step (e) due to changes in the magnetic field of said magnetically recorded media; and
    (g) computing the magnetic fields associated with said recordings of step (f) by using a mathematical equation that relates the position of said magnetic probe to the strength of the magnetic field.

2. The method of claim 1 further comprising the step of plating said magnetic probe and said magnetically recorded media with at least three-hundred angstroms of gold in order to reduce spurious probe deflection due to surface oxides on either said magnetic probe or said magnetically recorded media.

3. The method of claim 1 wherein said step of replacing the fine metallic tip of a scanning tunneling microscope with a flexible thin-film magnetic probe is accomplished by replacing the fine metallic tip of said scanning tunneling microscope with a thin-film nickel probe.

4. The method of claim 1 wherein said step of replacing the fine metallic tip of a scanning tunneling microscope with a flexible thin-film magnetic probe is accomplished by replacing the fine metallic tip of said scanning tunneling microscope with a thin-film iron probe.

5. A method of measuring magnetic fields on magnetically recorded media comprising the steps of:
    (a) replacing the fine metallic tip of a scanning tunneling microscope with a flexible thin-film magnetic probe in order to relate probe position to magnetic field strength;
    (b) removing any protective layer from said magnetically recorded media so that said protective layer does not impede the establishment of a tunneling current between said magnetic probe and said magnetically recorded media;

(c) aligning said magnetic probe with a recorded track of said magnetically recorded media at an angle of zero degrees;

(d) positioning the tip of said magnetic probe to said magnetically recorded media at an angle in the range of zero degrees to pi/2 degrees in order to establish said tunneling current;

(e) scanning said recorded track of said magnetically recorded media with said magnetic probe a first time;

(f) recording changes in position of said magnetic probe during said scanning of step (e) due to changes in the magnetic field of said magnetically recorded media;

(g) positioning the tip of said magnetic probe to said magnetically recorded media at an angle in the range of zero degrees to pi/2 degrees but at an angle that is different then the angle used in step (d) in order to establish said tunneling current;

(h) scanning said recorded track of said magnetically recorded media with said magnetic probe a second time;

(i) recording changes in position of said magnetic probe during said scanning of step (h) due to changes in the magnetic field of said magnetically recorded media;

(j) positioning the tip of said magnetic probe to said magnetically recorded media at an angle in the range of zero degrees to pi/2 degrees but at an angle that is different than the angles used in step (d) and step (g) in order to establish said tunneling current;

(k) scanning said recorded track of said magnetically recorded media with said magnetic probe a third time;

(l) recording changes in position of said magnetic probe during said scanning of step (k) due to changes in the magnetic field of said magnetically recorded media;

(m) combining the resulting three recordings of step (f), step (i), and step (l) linearly in order to obtain a single record of the position changes of said magnetic probe due to changes in the magnetic field of said magnetically recorded media; and (n) computing the magnetic fields associated with said combination of step (m) by using a mathematical equation that relates the position of said magnetic probe to the strength of the magnetic field.

6. The method of claim 5 further comprising the step of plating said magnetic probe and said magnetically recorded media with at least three-hundred angstroms of gold in order to reduce spurious probe deflection due to surface oxides on either said magnetic probe or said magnetically recorded media.

7. The method of claim 5 wherein said step of replacing the fine metallic tip of a scanning tunneling microscope with a flexible thin-film magnetic probe is accomplished by replacing the fine metallic tip of said scanning tunneling microscope with a thin-film nickel probe.

8. The method of claim 5 wherein said step of replacing the fine metallic tip of a scanning tunneling microscope with a flexible thin-film magnetic probe is accomplished by replacing the fine metallic tip of said scanning tunneling microscope with a thin-film iron probe.

* * * * *